US006774725B2

United States Patent
Miki et al.

(10) Patent No.: US 6,774,725 B2
(45) Date of Patent: Aug. 10, 2004

(54) POWER SUPPLY SYSTEM FOR A HIGH FREQUENCY POWER AMPLIFIER

(75) Inventors: Osamu Miki, Komoro (JP); Yasuhiro Nunogawa, Takasaki (JP); Tomomichi Koizumi, Komoro (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/289,342

(22) Filed: Nov. 7, 2002

(65) Prior Publication Data

US 2003/0107440 A1 Jun. 12, 2003

(30) Foreign Application Priority Data

Dec. 11, 2001 (JP) ........................................ 2001-377484

(51) Int. Cl.[7] ............................................... H03F 3/04
(52) U.S. Cl. ........................................ 330/297; 330/127
(58) Field of Search ........................ 330/10, 127, 129, 330/199, 200, 297

(56) References Cited

U.S. PATENT DOCUMENTS

| 5,442,317 A | * | 8/1995 | Stengel ........................ 330/10 |
| 5,508,658 A | * | 4/1996 | Nishioka et al. ............ 330/297 |
| 5,604,924 A | * | 2/1997 | Yokoya ....................... 330/297 |
| 5,929,702 A | * | 7/1999 | Myers et al. ................ 330/297 |

FOREIGN PATENT DOCUMENTS

JP 2000-151310 5/2000

* cited by examiner

*Primary Examiner*—Khanh Van Nguyen
(74) *Attorney, Agent, or Firm*—Mattingly, Stanger & Malur, P.C.

(57) ABSTRACT

The present invention provides a power supply circuit, which supplies a power supply voltage to a high frequency power amplifier. The power supply circuit comprises a DC—DC converter, a voltage control transistor, and a control circuit which controls the voltage control transistor. When the power supply circuit is used in a CDMA-system cellular phone, the power supply circuit supplies a power supply voltage generated by the DC—DC converter to the high frequency power amplifier upon a low output, whereas upon a high output, the power supply circuit turns on the voltage control transistor to directly supply a battery voltage to the high frequency power amplifier. On the other hand, when the power supply circuit is used in a CGS-system cellular phone, the power supply circuit supplies a power supply voltage generated by the DC—DC converter to the high frequency power amplifier, whereas upon a high output, the voltage control transistor is controlled by the control circuit based on a signal for designating an output level to generate a power supply voltage supplied to the high frequency power amplifier.

10 Claims, 9 Drawing Sheets

CDMA SYSTEM

GSM SYSTEM OPEN LOOP

GSM SYSTEM CLOSED LOOP (AT OPERATION OF SYNCHRONOUS RECTIFYING CIRCUIT)

(AT CUT OF SYNCHRONOUS RECTIFYING CIRCUIT)

POWER SUPPLY SYSTEM FOR A HIGH FREQUENCY POWER AMPLIFIER

BACKGROUND OF THE INVENTION

The present invention relates to a technology effective for application to a power supply circuit for a high frequency power amplifier, which is used in a wireless communication apparatus such as a cellular phone or the like, and particularly to a power supply circuit available for a cellular phone having a plurality of systems such as a GSM (Global System for Mobile Communication) system, a CDMA (Code Division Multiple Access) system, etc.

As a power supply circuit for a high frequency power amplifier of a cellular phone, there has currently been known a technology wherein a voltage converter circuit like a DC—DC converter and a power switch comprising MOSFET or the like are utilized in combination, and when output power is low, the power switch is turned off and a voltage stepped down by the DC—DC converter is used, whereas when the output power is high, the DC—DC converter is turned off and the power switch is turned on to supply a battery voltage to the high frequency power amplifier as a source or power supply voltage as it is, thereby enhancing power efficiency of the whole system.

On the other hand, since the GSM system is higher in output power than CDMA, a power supply circuit using a DC—DC converter is not provided, and an APC (Automatic Power Control) circuit is provided which effects feedback onto a gate bias circuit which detects a DC level of an output and generates a gate bias voltage of an output power element so as to reach output power necessary for calling (see, for example, Unexamined Patent Publication No. 2000-151310). Such a control system is generally called "closed loop system or type".

However, the system of controlling the output power according to the closed loop type has the problem that since there is a need to provide the APC circuit, a circuit scale increases correspondingly and a packaging density is reduced. Therefore, there is provided a system for controlling a source or power supply voltage of an output power FET based on a signal for designating an output level, so that the output level changes in proportion to the signal to thereby linearly operate the output power FET, thus ensuring linearity of an output of a high frequency power amplifier. This system is called an "open loop system or type" and has the advantage of enabling a reduction in circuit scale as compared with the closed loop system.

SUMMARY OF THE INVENTION

A standard DC—DC converter incapable of performing complex control is now used in a CDMA-system cellular phone. However, if a power supply circuit is configured using the standard DC—DC converter even though the cellular phone is considered to proceed toward more multi-functioning from now on, it is difficult to cope with the multi-functioning in this way. If an attempt is made to configure a power supply circuit capable of performing the complex control by using standard electronic parts, then the number of parts increases and a packaging density is reduced, thus causing difficulty in reducing the size of the cellular phone. Although the cellular phone is moving toward considerably achieving a reduction in power consumption, there has also been a strong need for a further reduction in power consumption. The reduction in power consumption has heretofore been made with an eye to enhancing the efficiency of a high frequency power amplifier. However, only the enhancement of the efficiency of the high frequency power amplifier makes unattainable a sufficient reduction in power consumption.

An object of the present invention is to provide a power supply circuit for a high frequency power amplifier, which is capable of reducing power consumption and thereby increasing a call time of a cellular phone and the life of a battery.

Another object of the present invention is to provide a power supply circuit for a high frequency power amplifier, which is capable of being used in a cellular phone capable of communicating according to a plurality of systems like a GSM system and a CDMA system and providing a reduction in power consumption.

A further object of the present invention is to provide a power supply circuit for a high frequency power amplifier, which is capable of reducing the number of parts and thereby reducing its size in a case where the power supply circuit capable of performing complex control with multi-functioning of a cellular phone is configured.

The above, other objects and novel features of the present invention will become apparent from the description of the present specification and the accompanying drawings.

Summaries of typical ones of the inventions disclosed in the present application will be described in brief as follows:

A power supply circuit, which supplies a power supply voltage to a high frequency power amplifier, comprises a voltage converter circuit of a switching power type like a DC—DC converter, a voltage control transistor like an FET, and a power control circuit which controls the voltage control transistor. When the power supply circuit is used in a CDMA-system cellular phone, it supplies a power supply voltage generated by the DC—DC converter to the high frequency power amplifier upon a low output, whereas upon a high output, the power supply circuit turns on the voltage control transistor to directly supply a battery voltage to the high frequency power amplifier. On the other hand, when the power supply circuit is used in a GSM-system cellular phone, the power supply circuit supplies a power supply voltage generated by the DC—DC converter to the high frequency power amplifier upon a low output. Upon a high output, the voltage control transistor is controlled by a control circuit based on a signal for designating an output level to thereby generate a power supply voltage supplied to the high frequency power amplifier.

According to the above means, the power supply circuit for the high frequency power amplifier can be shared between the CDMA-system cellular phone and the GSM-system cellular phone, for example. Thus, the number of parts constituting the power supply circuit of the cellular phone configured so as to be capable of performing communications of at least two systems can be reduced, and hence the cellular phone can be brought into less size. Since the efficiency at the low output is enhanced in GSM-system communications, current consumption decreases and the cellular phone using the power supply circuit is capable of increasing a call time and the life of a battery.

Further, a power supply circuit for a high frequency power amplifier, which is used in a CDMA-system cellular phone configured so as to be capable of detecting an output level of the high frequency power amplifier to thereby control a bias voltage of the high frequency power amplifier, is made up of a DC—DC converter, a voltage control transistor, and a control circuit for controlling the voltage control transistor. In a first mode or a system (closed loop) in which the output level of the high frequency power amplifier is detected to control the bias voltage of the high frequency power amplifier, a power supply voltage produced by the DC—DC converter is supplied to the high frequency power amplifier upon a low output, whereas upon a high output, the voltage control transistor is turned on to directly supply a battery voltage to the high frequency power amplifier. On the other hand, in a second mode or a system (open loop) for controlling the power supply voltage for the high frequency power amplifier without depending on a signal for detecting the output level of the high frequency power amplifier, the voltage control transistor is controlled based on a signal for designating or specifying the output level to thereby generate a power supply voltage corresponding to the output level designating signal, followed by supply to the high frequency power amplifier.

According to the above means, the power supply circuit for the high frequency power amplifier can be shared between, for example, a mode or system in which a GSM-system cellular phone performs transmission in a closed-loop system or type, and a mode or system in which it performs transmission in an open loop system or type. Thus, the number of parts constituting the power supply circuit of the cellular phone configured so as to be capable of performing communications of at least two systems can be reduced, and hence the cellular phone can be brought into less size.

Preferably, a filter circuit using a ferrite bead as an inductor is provided at an output terminal of the DC—DC converter. Thus, noise produced due to a switching operation of the DC—DC converter can be cut.

Further, preferably, the power control circuit for controlling the voltage control transistor based on the output level designating signal makes use of a circuit which comprises an amplifier (operational amplifier circuit) that outputs a voltage corresponding to the output level designating signal, and a MOSFET having a gate controlled based on the output of the amplifier to output a source or power supply voltage of an output power FET from its drain, and which feeds back the drain voltage of the MOSFET to the amplifier to thereby generate a desired power supply voltage. When the voltage control transistor is on-off controlled according to the closed-loop system, the output of the amplifier is brought to full amplitude to thereby perform its on-off control. Thus, the response to a control signal is improved.

Further, when the DC—DC converter makes use of a synchronous rectifying circuit configured so as to complementarily on-off control a first switch element and a second switch element connected in series between a voltage input terminal and a reference potential terminal to allow a current to flow through an inductor connected between a connecting node of the first switch element and the second switch element and an output terminal, thereby outputting a voltage obtained by stepping down the voltage applied to the voltage input terminal, the second switch element is controlled so as to avoid its turning on when the output level designating signal indicates a predetermined level or less, thereby outputting a desired voltage under a switching operation of the first switch element. Thus, the output of the DC—DC converter varies between a power supply voltage (Vdd) and a negative potential (−0.7V) and hence an operation margin for the DC—DC converter can be enhanced.

DETAILED DESCRIPTION OF THE PREFERRED EMBODIMENTS

Figure 1:
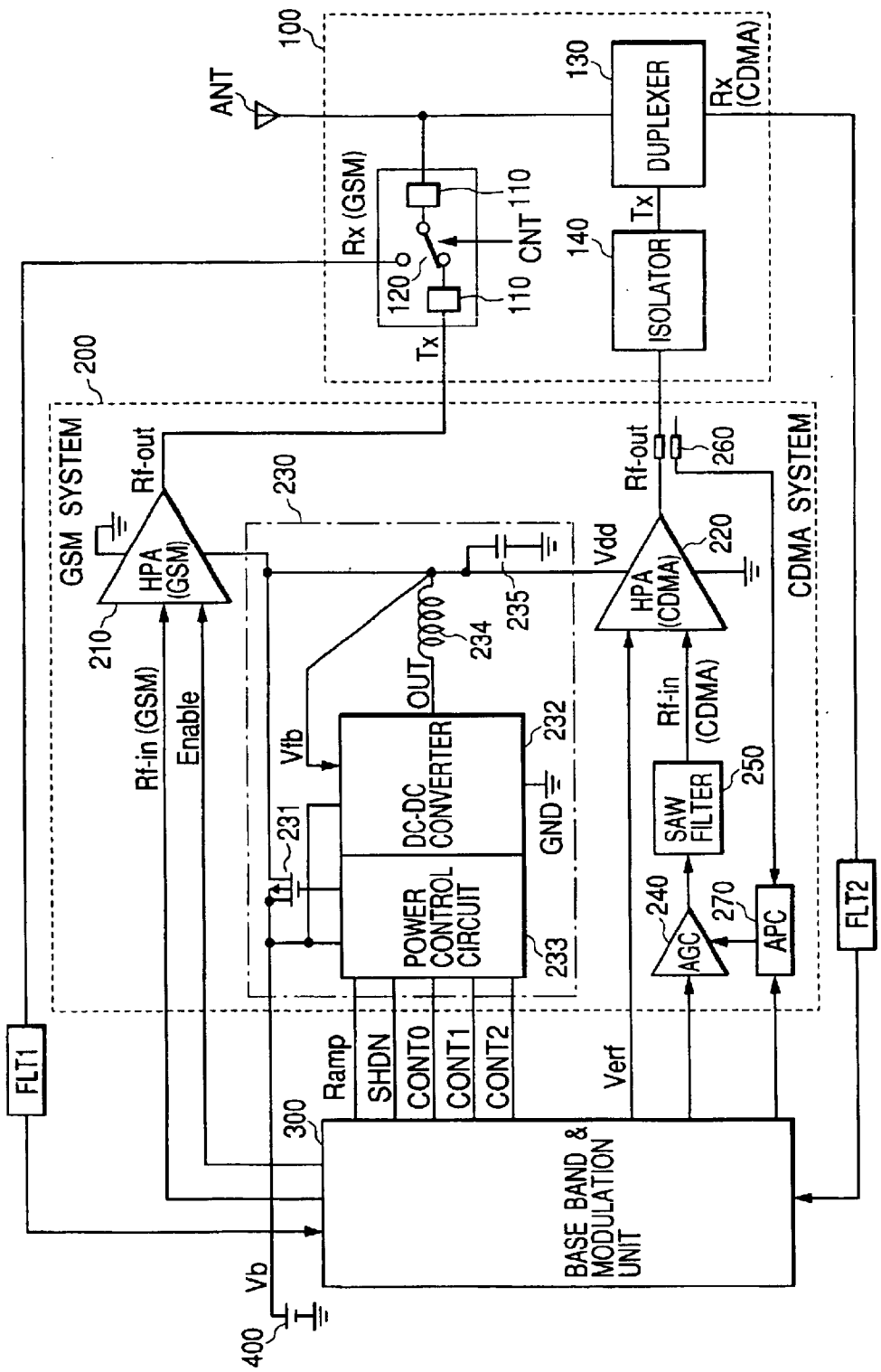
FIG. 1 is a block diagram showing a schematic configuration of a power supply circuit for a high frequency power amplifier according to the present invention and a system of a cellular phone using the same.

Preferred embodiments of the present invention will hereinafter be described in detail with reference to the accompanying drawings. Incidentally, components each having the same function in all the drawings for describing the embodiments of the present invention are respectively identified by the same reference numerals and their components will be explained.

FIG. 1 shows one embodiment of a system where the present invention is applied to a cellular phone transmittable and receivable by two types or systems of a GSM system and a CDMA system. Incidentally, the GSM system means a communication system in which a TDMA (Time Division Multiple Access) system is adopted as a data multiplexed system and a GMSK (Gaussian filtered Minimum Shift Keying) system is adopted as a modulation scheme in the present embodiment. Further, the CDMA system means a system of a cellular phone in which a CDMA (Code Division Multiple Access) system is adopted as a data multiplexed system.

In FIG. 1, ANT indicates an antenna for transmitting and receiving a signal wave, reference numeral 100 indicates a front end unit connected to the antenna ANT, reference numeral 200 indicates a high frequency amplifying unit including a high frequency power amplifier for amplifying a transmit signal and outputting the amplified signal therefrom and a power supply system or circuit thereof, and reference numeral 300 indicates a base band & modulation unit comprising a base band circuit for converting a voice signal to a base band signal, converting a receive signal to a voice signal and generating a transmit/receive switch signal or a modulation-scheme or mode switch signal, and a modem circuit for demodulating the receive signal to generate a base band signal and modulating a transmit signal, respectively. The base band & modulation unit 300 comprises a plurality of LSIs and ICs such as a DSP (Digital Signal Processor), a microprocessor, a semiconductor memory, etc.

The front end unit 100 comprises a low-pass filter 110 connected to a GSM transmit output terminal to attenuate harmonics, a transmit/receive selector switch circuit 120, a duplexer 130 which performs demultiplexing of a GSM-system signal and a CDMA-system signal, an isolator 140 connected between the CDMA transmit output terminal of the high frequency amplifying unit 200 and the duplexer 130, etc. These circuits and elements are mounted on one ceramic substrate or printed wiring board so as to be capable of being configured as a module.

A changeover signal CNT of the transmit/receive selector switch circuit 120 is supplied from the base band & modulation unit 300. Receive signals Rx (GSM) and Rx (CDMA) are supplied to the base band & modulation unit 300 via filters FLT1 and FLT2 which eliminate noise or interference.

The high frequency amplifying unit 200 includes a high frequency power amplifier 210 for GSM, a high frequency power amplifier 220 for CDMA, a power supply circuit 230 shared between these, a gain variable amplifier 240 which amplifies a CDMA transmit signal outputted from the base band & modulation unit 300, a SAW filter 250 which allows only signals in a desired frequency band to pass therethrough, a coupler 260 which detects an output level of the high frequency power amplifier 220 for CDMA, an automatic power controller 270 which compares the output level detected by the coupler 260 and a signal for designating or specifying an output level supplied from the base band & modulation unit 300 and thereby controls the gain of the gain variable amplifier 240 so that the output level coincides with the designated level, etc.

The power supply circuit 230 comprises a voltage control P-channel MOSFET 231 connected between a battery 400 and a power terminal for the high frequency power amplifiers 210 and 220, a DC—DC converter 232 which steps down a voltage Vb of the battery 400, a power control circuit 233 which generates a control signal used for each of the MOSFET 231 and the DC—DC converter 232, an inductor 234 connected between an output terminal of the DC—DC converter 232 and the power terminal for the high frequency power amplifiers 210 and 220, a smoothing condenser 235 which stabilizes a generated source or power supply voltage, etc.

In the present embodiment, the P-channel MOSFET 231, the inductor 234 and the smoothing condenser 235 are respectively made up of discrete electronic parts. The DC—DC converter 232 and the power control circuit 233 are configured as a semiconductor integrated circuit (IC). The IC and the discrete electronic parts such as the FET 231, the inductor 234, the smoothing capacitor 235, etc. are packaged on one ceramic substrate so as to be configured as a power supply module.

Incidentally, the gain variable amplifier 240 and the automatic power control circuit 270 can also be formed on one semiconductor chip as a semiconductor integrated circuit. As each of the semiconductor integrated circuit and the high frequency power amplifier 220, may be used one configured as another module (so-called RF module). When the front end unit 100 is configured as a module, the coupler 260 can be made up of a signal transfer microstrip line formed on a ceramic substrate for the front end module, and a conductor layer formed so as to be opposite to it with a dielectric layer interposed therebetween.

Figure 2:
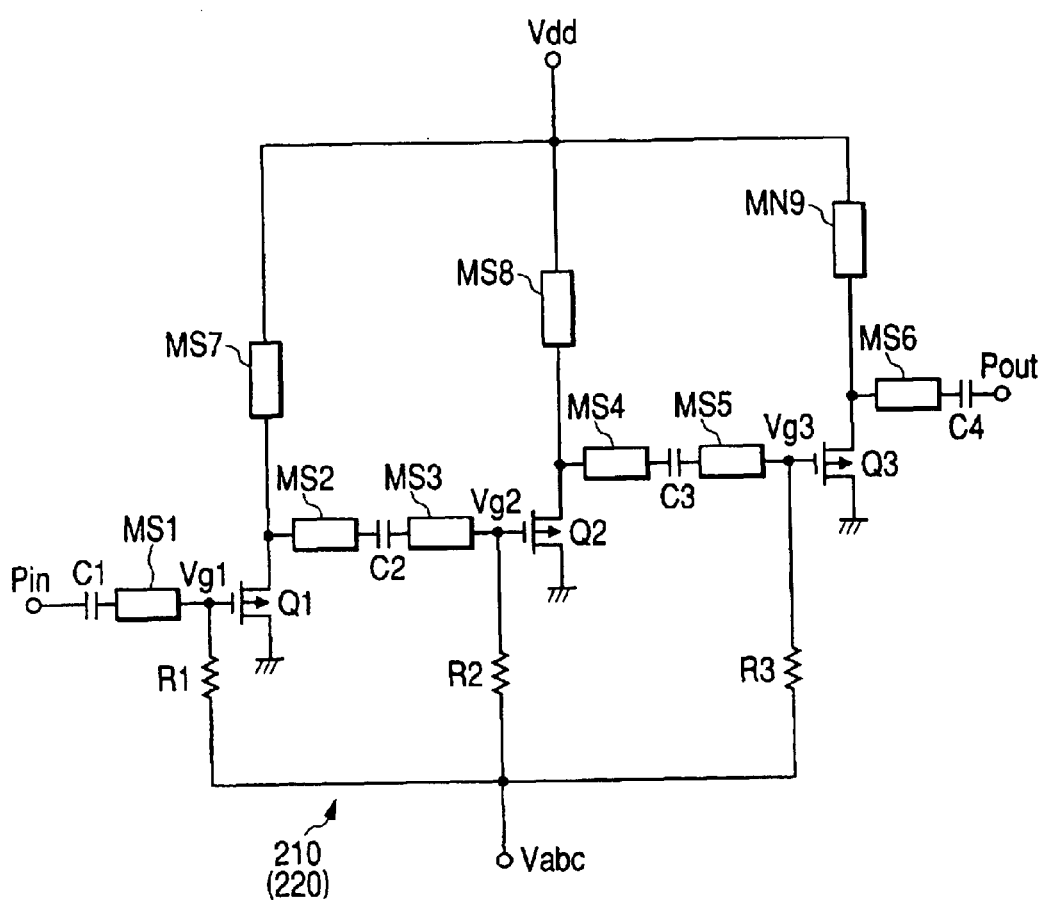
FIG. 2 is a circuit configurational diagram illustrating a specific example of the high frequency power amplifier supplied with a power supply voltage from the power supply circuit according to an embodiment.

FIG. 2 shows a circuit configurational example of the high frequency power amplifier 210 (220). The high frequency power amplifier 210 (220) employed in the present embodiment has a structure wherein a plurality of field effect transistors (hereinafter called also simply "transistors") are sequentially cascade-connected as active elements to thereby form a multistage configuration on a circuit basis. Namely, it takes a three-stage configuration wherein a gate terminal of a middle-stage transistor Q2 is connected to a drain terminal of a first-stage transistor Q1, and a gate terminal of a final-stage transistor Q3 is connected to a drain terminal of the middle-stage transistor Q2.

In the high frequency power amplifier 210 (220) shown in FIG. 2, a high-frequency signal Pin is inputted to a gate terminal of the first-stage transistor Q1 through a capacitive element C1. A drain terminal of the final-stage transistor Q3 is connected to an output terminal Pout through a capacitive element C4. Thus, the high frequency power amplifier cuts a dc component of the high-frequency input signal Pin and amplifies an ac component thereof, followed by its output. An output level at this time is controlled based on a bias control voltage Vabc and the power supply voltage Vdd from the power supply circuit 230. The bias control voltage Vabc is supplied to the gates of the transistors Q1, Q2 and Q3 through resistors R1, R2 and R3 so that bias voltages Vg1, Vg2 and Vg3 are applied thereto. The bias control voltage Vabc is supplied from, for example, the base band & modulation unit 300 according to the output level.

Incidentally, signs MS1 through MS6 in FIG. 2 respectively indicate microstrip lines which act as inductors for matching impedances between the respective stages. Signs MS7 through MS9 respectively indicate microstrip lines for matching impedances between the high frequency power amplifier and the power control circuit 233. The condensers C1, C2, C3 and C4 series-connected to the microstrip lines MS1 through MS6 serve so as to cut off dc voltages of the power supply voltage Vdd and the gate bias voltages (Vg1, Vg2 and Vg3).

In the high frequency power amplifier 210 (220), although not restricted in particular, the final-stage transistor Q3 comprises a discrete part (output power MOSFET or the like), and the first-stage and middle-stage transistors Q1 and Q2 and the resistors R1 and R2 are formed on one semiconductor chip as a semiconductor integrated circuit. Further, the condensers C1, C2, C3 and C4 are connected as external elements. The microstrip lines MS1 through MS9 are formed in conductive layer patterns such as copper or the like formed so as to assume desired inductance values, on a ceramic substrate equipped with a semiconductor chip formed with, for example, the transistors Q1 and Q2 and the resistors R1 through R3 constituting a bias circuit 14.

Figure 3:
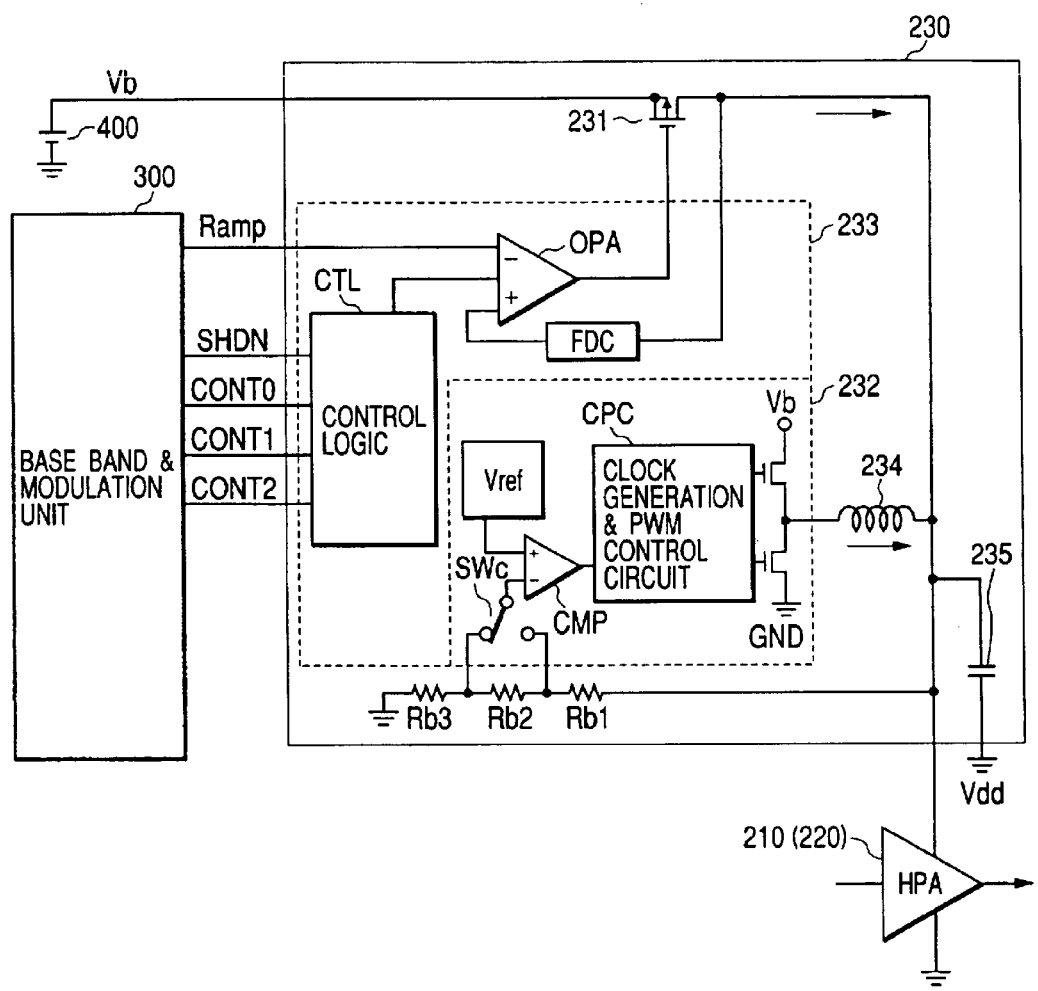
FIG. 3 is a circuit configurational diagram illustrating one embodiment of the power supply circuit for the high frequency power amplifier according to the present invention.

A more detailed configurational example of the power supply circuit 230 is illustrated in FIG. 3. The power supply circuit according to the present embodiment can be used even in any of the GSM closed-loop system, GSM open-loop system and CDMA system. Even when the power supply circuit is used in any system, the power supply circuit is contrived on a circuit basis so that power consumption of the high frequency power amplifier can be reduced.

In FIG. 3, Ramp indicates a control signal for designating or specifying an output level supplied from the base band & modulation unit 300 in the GSM system. The power control circuit 233 comprises an op amplifier (operational amplifier circuit) OPA which receives Ramp as an input, a feedback circuit FDC made up of a CR circuit, which effects feedback from a drain terminal of a P-channel MOSFET 231 controlled by the output of the op amplifier OPA and set so as to take out an output voltage Vdd from the drain terminal thereof, to a non-inversion input terminal of the op amplifier OPA, and a control logic CTL which generates activation signals for the op amplifier OPA and the DC—DC converter 232, based on control signals SHDN, CONT0, CONT1 and CONT2 supplied from the base band & modulation unit 300. Although not restricted in particular, the output level control signal Ramp is inputted as a pulse, and the level of amplitude of the pulse is generated so as to represent the magnitude of a required output level.

The DC—DC converter 232 comprises a reference generator VRG which generates a reference voltage Vref, like a bandgap reference circuit, switches SW1 and SW2 comprising MOSFETs, which are connected in series between a power supply or source voltage terminal Vb and a ground point GND, a clock generation & PWM control circuit CPC which generates a signal (control pulse) applied to each of the gates of the switches SW1 and SW2 to on-off control each of theses and a clock signal necessary to generate the control pulse, a comparator CMP which compares the reference voltage Vref and a voltage obtained by feeding back an output voltage to thereby generate a control signal for the clock generation & PWM control circuit CPC, etc.

The power supply circuit 230 according to the present embodiment controls a voltage applied to the gate of the P-channel MOSFET 231 in a GSM-system open-loop mode in which the output voltage Vdd is fed back to the non-inversion input terminal of the op amplifier OPA via the CR circuit FDC to thereby bring the control signal SHDN supplied from the base band & modulation unit 300 to a high level to operate the op amplifier OPA, to thereby make it possible to output a voltage Vdd which changes approximately linearly with respect to the input voltage Ramp.

On the other hand, the power supply circuit 230 turns off the P-channel MOSFET 231 in a CDMA-system operation mode, based on the control signal SHDN supplied from the control logic CTL when the required output level is low, to turn on the DC—DC converter 232 so as to output the voltage produced from the DC—DC converter 232, whereas when the required output level is high, the power supply circuit 230 turns off the DC—DC converter 232 to bring the P-channel MOSFET 231 into a complete on-state, thereby making it possible to output the voltage Vb of the battery 400 in a through state. Incidentally, the P-channel type is used as the output MOSFET 231 in that the output power supply voltage Vdd can be raised up to near the battery voltage Vb as compared with an N-channel type MOSFET. It is thus possible to reduce a power loss.

Further, when the DC—DC converter 232 is operated to supply a stepped-down voltage, the power supply circuit 230 according to the present embodiment switches the output voltage Vdd to a plurality of stages (e.g., two stages) according to the required output level. The switching to the output voltage Vdd is performed as follows: Bleeder resistors Rb1, Rb2 and Rb3 are provided in the course of a path for feeding back the output voltage of the DC—DC converter 232 to the comparator CMP to divide the output voltage by a resistance ratio. Then the switch SWC on the inversion input side of the comparator CMP is changed over according to the control signal generated by the control logic CTL based on the control signals CONT0 through CONT2 supplied from the base band & modulation unit 300 to thereby select and feed back any of the voltages divided by the bleeder resistors, whereby the above switching is carried out. While the bleeder resistors Rb1, Rb2 and Rb3 and switch SWC for switching the output level to the two stages are shown in FIG. 3 in the interest of illustrations, the embodiment is configured so that the output level can be switched to three stages.

Figure 4:
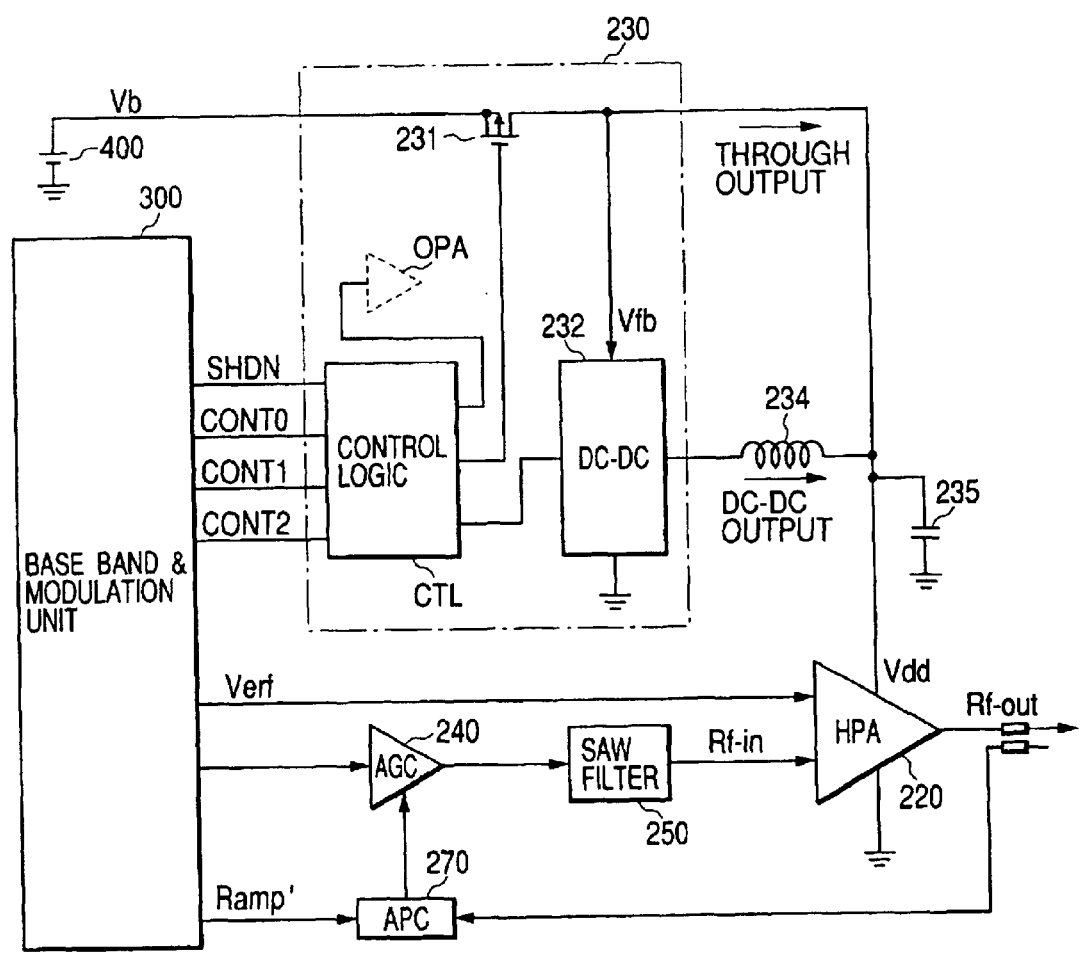
FIG. 4 is a block diagram showing a schematic configuration of a system of the CDMA cellular phone using the power supply circuit according to the embodiment.
Figure 5:
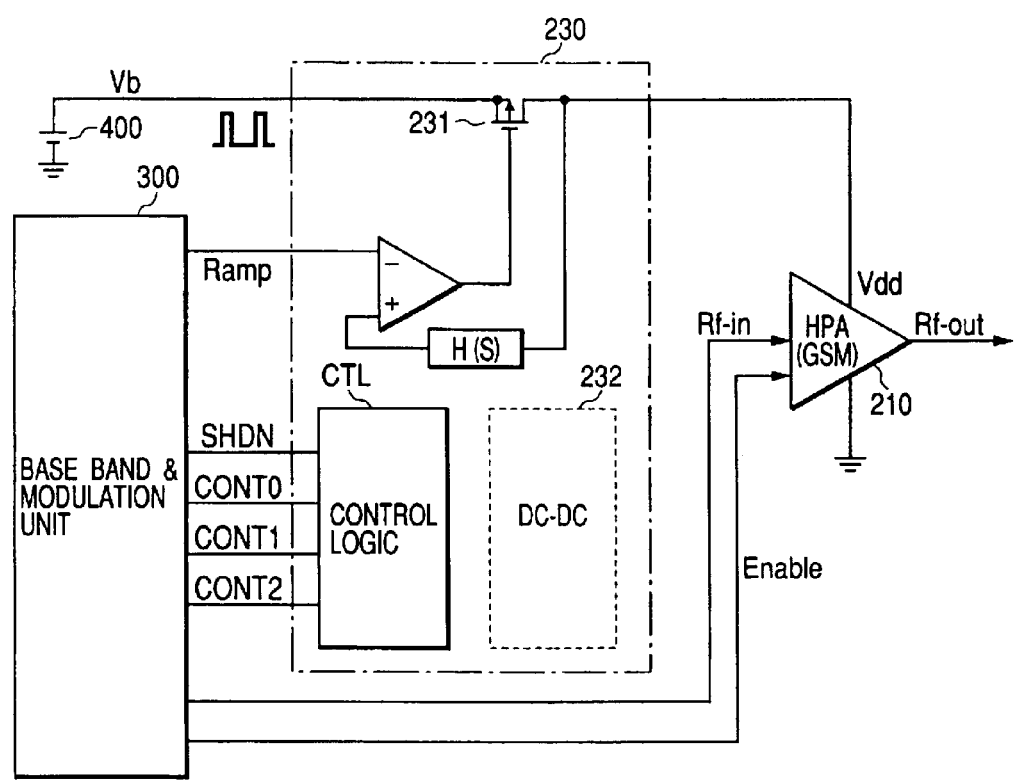
FIG. 5 is a block diagram illustrating a schematic configuration of a system of the cellular phone of GSM closed-loop type, using the power supply circuit according to the embodiment.
Figure 6:
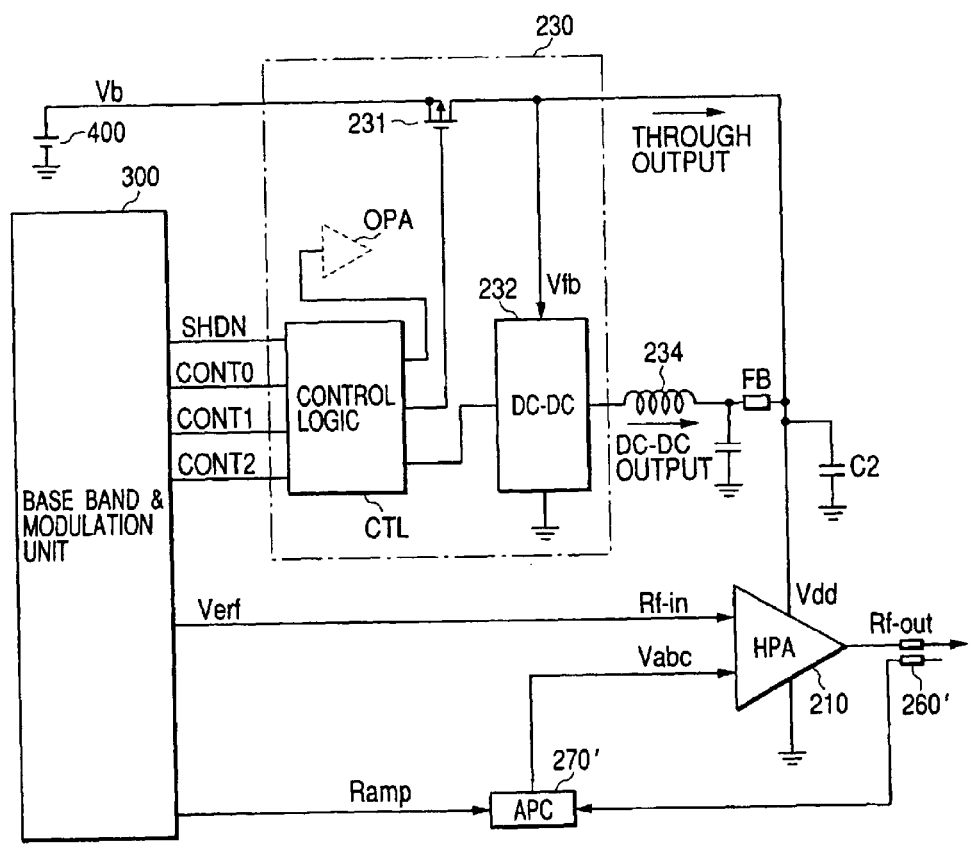
FIG. 6 is a block diagram depicting a schematic configuration of a system of the cellular phone of GSM open-loop type, using the power supply circuit according to the embodiment.

FIG. 4 shows an example of a system configuration where the CDMA system of the cellular phone shown in FIG. 1 is operated, FIG. 5 illustrates an example of a system configuration where the GSM system of the cellular phone shown in FIG. 1 is activated in an open-loop type or system, and FIG. 6 depicts an example of a system configuration where the power supply circuit 230 is applied to a cellular phone of a GSM closed-loop system. Table 1 shows one example of the relationship between combinations of the control signals CONT0 through CONT2 and SHDN supplied from the base band & modulation unit 300 to the power supply circuit 230, their output states and operating states of the power supply circuit in the respective systems. The CDMA system and the system of the GSM open-loop type or system are identical to each other in the relationship between the combinations of the control signals CONT0 through CONT2 and SHDN, their output states and the operating states of the power supply circuit. However, an output voltage Vdd in each system can be set so as to reach a desired level by changing a resistance ratio of bleeder resistors Rb1 through Rb3 external to the power supply circuit.

TABLE 1

| Applied system method | Output state | Control signal input | | | | Operating state | | |
| --- | --- | --- | --- | --- | --- | --- | --- | --- |
| | | Cont0 | Cont1 | Cont2 | SHDN | PMOS | DC-DC | Vout (Vdd) |
| CDMA or GSM closed loop | high output | High | High | Low | High | On through | off | Vb (3.6 V) |
| | middle output | Low | High | Low | High | off | on | set voltage of 1 to 2 V |
| | Low output | Low | Low | Low | High | off | on | set voltage of 1.0 V or less |
| | Power | Low | Low | Low | Low | off | off | — |

TABLE 1-continued

| Applied system method | Output state | Control signal input | | | | Operating state | | |
| --- | --- | --- | --- | --- | --- | --- | --- | --- |
| | | Cont0 | Cont1 | Cont2 | SHDN | PMOS | DC-DC | Vout (Vdd) |
| GSM open loop | cutoff variable output | High | High | High | High | Linear operation | off | 0 to Vdd |
| | power cutoff | Low | Low | Low | Low | off | off | — |

In the system of FIG. 4 showing the example of the system configuration where the power supply circuit 230 is applied to the cellular phone of the CDMA system, the high frequency power amplifier 210, the transmit/receive selector switch 120, the filter 110 and the FLT1 in the GSM system are made unnecessary or respectively brought to a non-operating state.

In a power supply circuit 230, a control logic CTL brings an op amplifier OPA to a non-operating state according to a control signal SHDN supplied from a base band & modulation unit 300. When a required output level is low, the control logic CTL activates a DC—DC converter 232 to supply a stepped-down voltage as a power supply voltage Vdd for a high frequency power amplifier 220. When the required output level is high, the control logic CTL turns off the DC—DC converter 232 and turns on a P-channel MOSFET 231 as an alternative to it to thereby supply a battery voltage Vb as the power supply voltage Vdd for the high frequency power amplifier 220 as it is.

At this time, a signal for turning on the P-channel MOSFET 231 is generated by the control logic CTL and may be directly supplied to a gate terminal of the P-channel MOSFET 231. Alternatively, the op amplifier OPA may be operated as a buffer or comparator so that the P-channel MOSFET 231 is brought to a complete on state (battery voltage through state) by the output of the op amplifier OPA.

Such control is performed as follows: For example, an inversion input terminal of the op amplifier OPA inputted with an output level control signal Ramp in an open loop is pulled up to Vdd. When it is desired to turn off the P-channel MOSFET 231, the control logic CTL supplies Vdd to a non-inversion input terminal of the op amplifier OPA, whereas when it is desired to turn on the P-channel MOSFET 231, the control logic CTL supplies a ground potential to the non-inversion input terminal, whereby the above control can be carried out. Since the P-channel MOSFET 231 is an element relatively large in size and is also large in gate capacitance, an on-off operation can be speeded up by controlling the P-channel MOSFET 231 via the op amplifier OPA rather than by directly on/off-controlling the P-channel MOSFET 231 by the control logic CTL comprising MOSFETs.

In a high frequency power amplifying unit, an automatic power control circuit 270 compares an output level detected by a coupler 260 and a signal (Ramp') for designating or specifying an output level supplied from the base band & modulation unit 300 even when the required output level is high and low. Further, the automatic power control circuit 270 controls the gain of a gain variable amplifier 240 so that the output level coincides with the designated level, and the high frequency power amplifier 220 amplifies a high frequency transmit signal Rf-in and outputs it therefrom.

In FIG. 5 showing the system configuration where the GSM system of the cellular phone shown in FIG. 1 is operated in the open loop system, the high frequency power amplifier 220 of the CDMA system, the isolator 140, the duplexer 130 and the filter FLT2 are made unnecessary or respectively brought to a non-operating state.

In a power supply circuit 230 of this system, a control logic CTL brings an op amplifier OPA to an operating state according to a control signal SHDN supplied from a base band & modulation unit 300. Thus, the op amplifier OPA drives a P-channel MOSFET 231 according to an output level control signal Ramp supplied from the base band & modulation unit 300 to generate a voltage Vdd which linearly changes according to the output level control signal Ramp, thereby supplying the voltage Vdd to a high frequency power amplifier 210 as a power supply voltage Vdd and bringing a DC—DC converter 232 to a non-operating state.

Owing to the supply of the power supply voltage Vdd sent from the P-channel MOSFET 231 controlled in the above-described manner to the high frequency power amplifier 210, an output Vout of the high frequency power amplifier 210 changes approximately linearly with respect to the input voltage Ramp.

In FIG. 6 showing the example of the system configuration where the power supply circuit 230 shown in FIG. 3 is applied to the cellular phone of the GSM closed-loop system, the high frequency power amplifier 220, the isolator 140, the duplexer 130 and the filter FLT2 in the CDMA system are made unnecessary. As an alternative to it, there are provided a couple 260' which detects an output level of a high frequency power amplifier 210, and an automatic power control circuit 270' which compares the output level detected by the coupler 260' and a signal Ramp for designating an output level supplied from a base band & modulation unit 300 to thereby generate a bias voltage Vabc of the high frequency power amplifier 210 so that the output level coincides with the designated level.

In the power supply circuit 230 of this closed-loop system, a control logic CTL brings an op amplifier OPA to a non-operating state according to a control signal SHDN supplied from the base band & modulation unit 300. When a required output level is low, the control logic CTL operates a DC—DC converter 232 to supply a stepped-down voltage as a power supply voltage Vdd for the high frequency power amplifier 210. When the required output level is high, the control logic CTL turns off the DC—DC converter 232 and turns on the P-channel MOSFET 231 as an alternative to it to thereby supply a battery voltage Vb as the power supply voltage Vdd for the high frequency power amplifier 210 as it is.

Even in this case, a signal for turning on the P-channel MOSFET 231 is generated by the control logic CTL and may be directly supplied to a gate terminal of the P-channel MOSFET 231. Alternatively, the op amplifier OPA may be operated as a buffer or comparator so that the P-channel MOSFET 231 is brought to a complete on state (battery voltage through state) by the output of the op amplifier OPA.

In a high frequency power amplifying unit, the automatic power control circuit 270' compares the output level detected by the coupler 260' and the signal Ramp for designating or specifying the output level supplied from the base band & modulation unit 300 even when the required output level is high and low, and thereby generates the bias voltage Vabc for the high frequency power amplifier 210 so that the output level coincides with the designated level.

Figure 7:
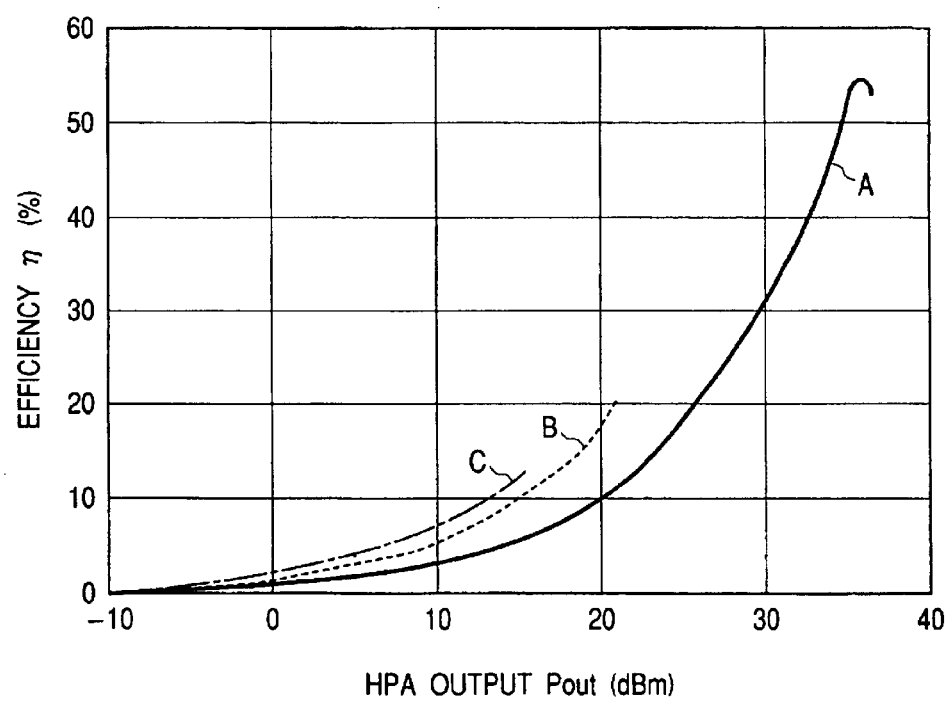
FIG. 7 is a graph showing input/output characteristics of a high frequency power amplifier employed in the cellular phone of GSM open-loop type, using the power supply circuit according to the embodiment.

When the above-described power supply voltage Vdd outputted from the P-channel MOSFET 231 is supplied to the high frequency power amplifier 210 up to a very low range of the required output level without the use of the DC—DC converter to activate the high frequency power amplifier 210, the efficiency of the high frequency power amplifier 210 is represented as indicated by a curve A of FIG. 7. However, when the voltage outputted from the DC—DC converter is supplied in the region in which the required output level is very low, under the application of the power supply circuit according to the above embodiment, the efficiency of the high frequency power amplifier 210 in the system of the GSM closed-loop type is represented as indicated by a curve B designated at sign B of FIG. 7 where the frequency is set as 880 MHz and the DC—DC converter 232 steps a power supply voltage Vdd of 3.5V down to 1.5V, for example, and supplies it. Further, the efficiency thereof is represented as indicated by a curve designated at sign C of FIG. 7 where the DC—DC converter 232 steps the power supply voltage Vdd of 3.5V down to 1.0V and supplies it.

Owing to the application of the present embodiment in this way, the efficiency in the low output region can be enhanced. Since the cellular phone is often used at a low output rather than used at a high output, the efficiency in the low output region is improved as in the embodiment although the efficiency in a high output region is not so changed as compared with the prior art. Thus, the effect of suppressing the total power consumption can be expected.

In the system of the present embodiment, a filter comprising a ferrite bead FB and a capacitor C2 is provided between an inductor 234 and a smoothing condenser 235. This filter is capable of preventing noise produced by a switching operation of the DC—DC converter 232.

Further, a synchronous rectification type converter is used as the DC—DC converter 232 in such a system as shown in FIG. 4 or 5 using the power supply circuit 230 according to the embodiment. When the output level is low, the DC—DC converter 232 may be controlled by such a method as to be described later. Thus, an operation margin can be improved.

Figure 8:
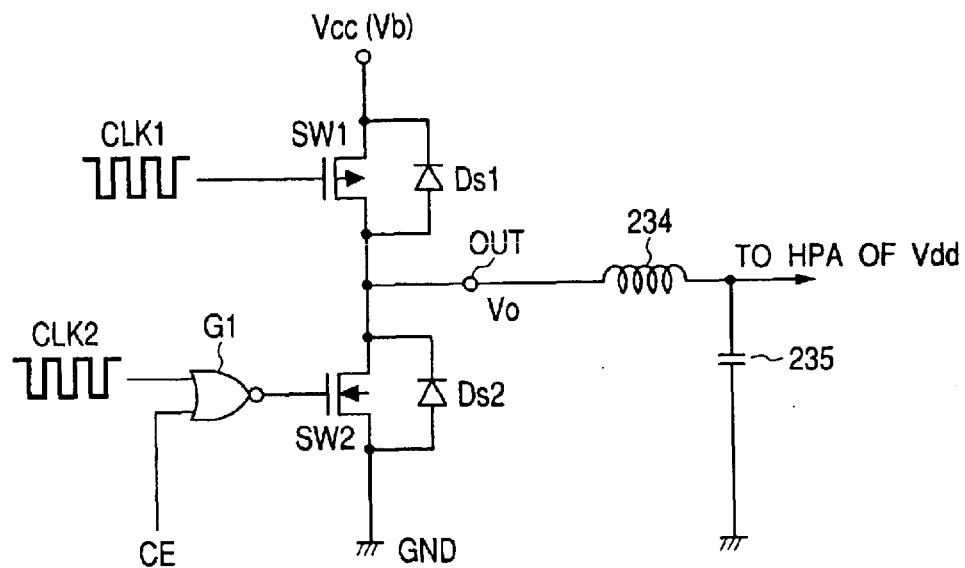
FIG. 8 is a circuit diagram showing a configuration of an output stage of a DC—DC converter which constitutes the power supply circuit according to the embodiment.

FIG. 8 shows a configuration of an output unit of the DC—DC converter 232. The DC—DC converter 232 employed in the present embodiment is one of such a type as called a so-called synchronous rectification type, which comprises switches SW1 and SW2 each comprising a MOSFET, which is series-connected between a power terminal Vcc inputted with a dc voltage supplied from a battery or the like and a reference potential terminal GND like a ground point, an inductor Lx connected between the other end thereof and an output terminal OUT of the DC—DC converter, and a smoothing capacitor Cx connected to the other end of the inductor Lx.

The switches SW1 and SW2 are alternately turned on by clocks CLK1 and CLK2. When the switch SW2 is turned off and the switch SW1 is turned on, a current flows from the power terminal Vdd to the inductor Lx. When the switch SW1 is turned off and the switch SW2 is turned on, a current flows from the ground point to the inductor Lx. Thus, voltages corresponding to the frequencies of the clock CLK1 and CLK2 and their pulse widths are outputted. The clocks CLK1 and CLK2 for on-off controlling the switches SW1 and SW2 are respectively formed so as to have dead times for preventing the flow of a through current due to a simultaneous on state of the switches SW1 and SW2.

In the present embodiment, a NOR gate G1 for cutting off or blocking the supply of the clock CLK2 is provided on a supply path of the clock CLK2 used to control the switch SW2 on the ground point side. A clock control signal CE supplied from the control logic CTL or the like is inputted to the other input terminal of the NOR gate G1. When the required output level of the high frequency power amplifier is reduced, the clock control signal CE is changed to a high level. In doing so, the output of the NOR gate G1 is fixed to a low level so that the switch SW2 is continuously brought to an off state. Therefore, when the switch SW1 is changed from on to off, the current that will continue to flow through the inductor Lx, is supplied through a PN junction diode Ds2 lying between a source region of the switch MOSFET SW2 held in the off state and a substrate.

Figure 9A:
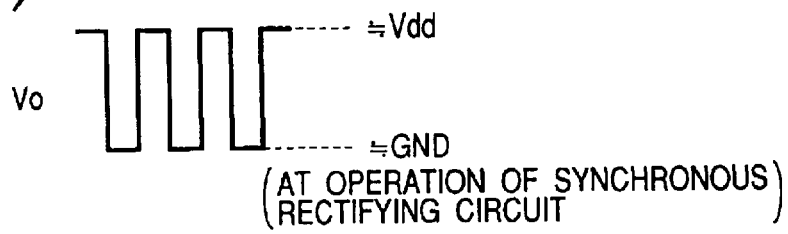
FIG. 9 is a waveform diagram showing output waveforms obtained where a synchronous rectifying circuit on the ground point side of the output stage of the DC-Dc converter of FIG. 7 is operated and cut off.
Figure 9B:
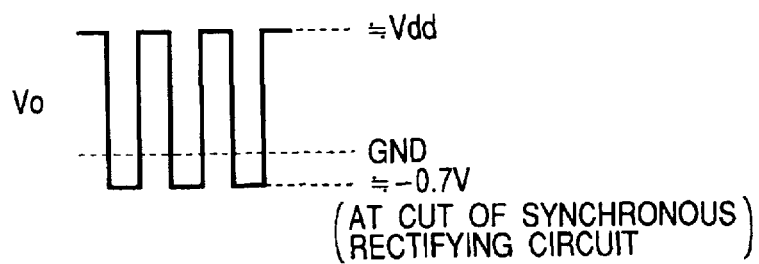

As a result, a potential Vo at the output terminal OUT is set to a negative potential reduced by a forward voltage (about 0.7V) from a ground potential (0V). Thus, upon the normal switching operation, the output of the DC—DC converter amplitude-operated between a power supply voltage Vdd and a ground potential GND as shown in FIG. 9(A) varies between the power supply voltage Vdd and—0.7V as shown in FIG. 9(B) by cutting-off of the control clock CLK2 for the switch SW2 on the ground point side. Therefore, an operation margin for the DC—DC converter is enhanced, and hence the DC—DC converter is capable of operation up to such a range that the required output level of the high frequency power amplifier is low. Lowering the minimum output level makes it possible to reduce power consumption of the high frequency power amplifier.

On the other hand, when the power supply voltage Vdd from the above P-channel MOSFET 231 is supplied to the high frequency power amplifier 210 to activate the high frequency power amplifier 210 up to a range in which the required output level is very low, in the system of the GSM open loop type shown in FIG. 5, the output Vout of the high frequency power amplifier 210 changes approximately linearly with respect to the input voltage Ramp, but the efficiency of the high frequency power amplifier 210 is decreased.

Therefore, an embodiment of a power supply circuit capable of increasing the efficiency in a low range of a required output level even if it is used in the system of the GSM open loop type, and a configurational example of the system of the GSM open loop type using the same will next be explained using FIG. 10.

Figure 10:
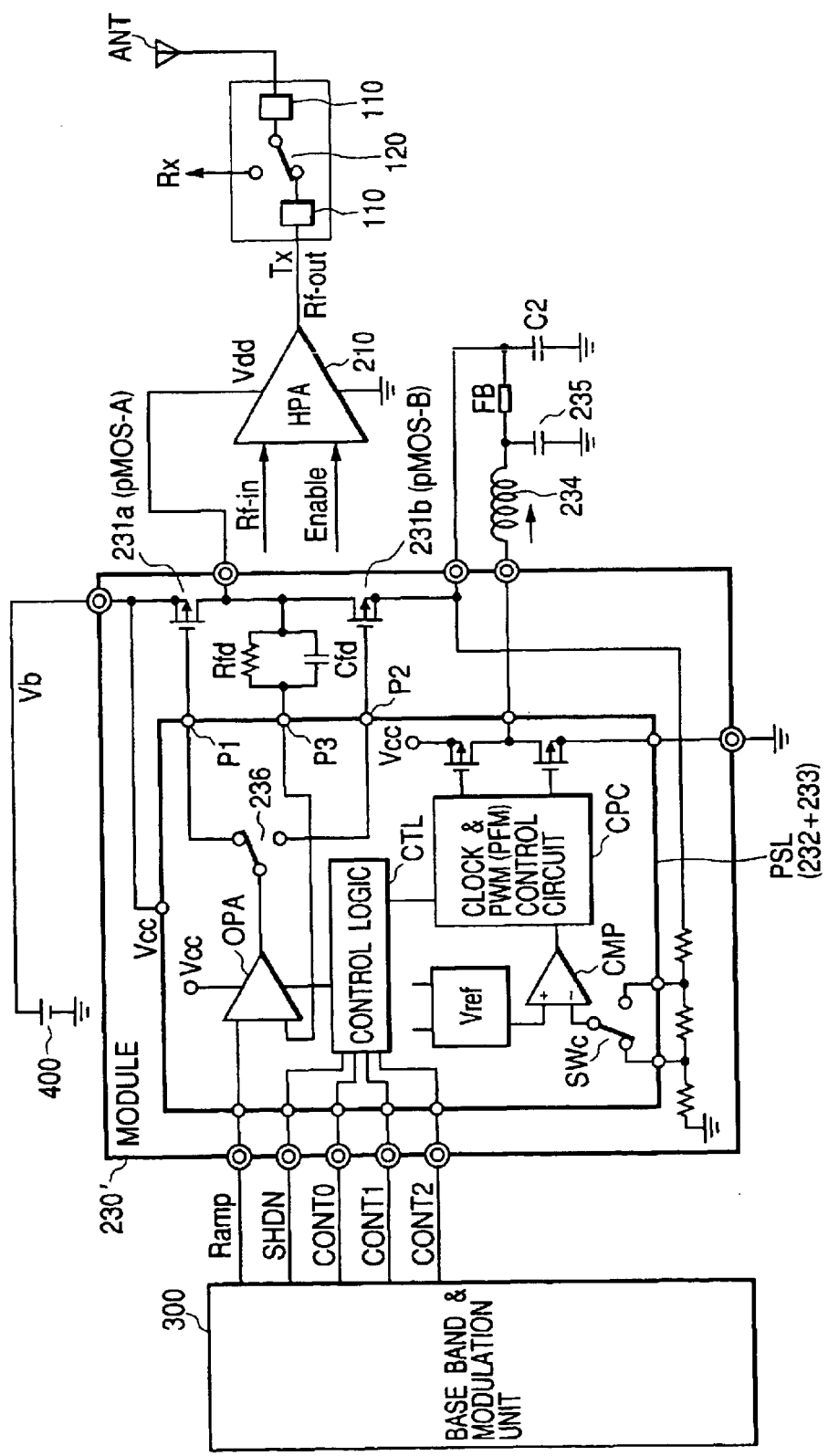
FIG. 10 is a block diagram showing a second embodiment of a power supply circuit for a high frequency power amplifier according to the present invention, and a schematic configuration of a system of a cellular phone of a GSM open-loop type, using the power supply circuit.

The power supply circuit according to the embodiment shown in FIG. 10 is one wherein a DC—DC converter 232 of a power supply circuit 230 is operated in the low range of the required output level even in the case of the system of the GSM open loop type. In the case of the use of the power supply circuit according to the embodiment, one example of the relationship between combinations of control signals CONT0 through CONT2 and SHDN supplied from a base band & modulation unit 300 to the power supply circuit 230, their output states and operating states of the power supply circuit in the respective systems is shown in Table 2.

TABLE 2

| Applied system method | Output state | Control signal input | | | | Operating state | | | |
|---|---|---|---|---|---|---|---|---|---|
| | | Cont0 | Cont1 | Cont2 | SHDN | PMOS-A | PMOS-B | DC-DC | Vout (Vdd) |
| GSM open loop | high output | High | High | High | High | linear operation | off | off | 0 to 3.6 V |
| | middle output | Low | High | High | High | off | linear operation | on | 0 to 1.5 V |
| | low output | Low | Low | High | High | off | linear operation | on | 0 to 1.0 V |
| | power cutoff | Low | Low | High | Low | off | off | off | — |
| CDMA or GSM closed loop | high output | High | High | Low | High | Complete on | off | off | Vb (3.6 V) |
| | middle output | Low | High | Low | High | off | complete on | on | set voltage of 1 to 2 V or less |
| | low output | Low | Low | Low | High | off | complete on | on | set voltage of 1.0 V or less |
| | power cutoff | Low | Low | Low | Low | off | off | off | — |

Owing to the application of the present embodiment, the DC—DC converter 232 is operated in the very low range of the required output level in the system of the GSM open loop type to supply a power supply voltage to a high frequency power amplifier 210. It is therefore possible to enhance power efficiency.

The power supply circuit according to the embodiment shown in FIG. 10 has a configuration similar to the power supply circuit shown in FIG. 3. A point of difference resides in that in the power supply circuit shown in FIG. 3, the DC—DC converter 232 and the power control circuit 233 are respectively configured as the discrete semiconductor integrated circuits, whereas in the present embodiment, the DC—DC converter 232 and a portion excluding the feedback circuit FDC of the power control circuit 233 are formed on one semiconductor chip so as to be configured as a power semiconductor integrated circuit PSL.

In the present embodiment as well, there are provided two terminals for outputting a signal for controlling gate terminals of external MOSFETs (MOSFET 231 in FIG. 3). A switch 236 for selectively connecting the two terminals P1 and P2 to an output terminal of an op amplifier OPA is provided on a chip. There is further provided a terminal P3 for connecting a resistor Rfd and a capacitor Cfd constituting the feedback circuit FDC of the op amplifier OPA as external parts. The selector switch 236 is controlled by a signal outputted from a control logic CTL, based on control signals CONT0 through CONT2 supplied from a base band & modulation unit 300. Incidentally, although not apparent on the drawing, a power supply voltage Vb is applied to a terminal on the non-selection side, which is disconnected from the switch 236, and hence a non-selected one of P-channel MOSFETs 231A and 231B is brought to an off state.

Further, in the present embodiment, the power semiconductor integrated circuit, the P-channel MOSFETs 231A and 231B (PMOS-A and PMOS-B) for power supply, the resistor Rfd and capacitor Cfd, and output-feedback bleeder resistors Rb1 through Rb3 of the DC—DC converter 232 are packaged on one ceramic substrate so as to be configured as a power supply module 230'.

As shown in Table 2, when a high output level in a GSM open loop is requested, the PMOS selector switch 236 is switched to the P-channel MOSFET 231A (PMOS-A) so that the P-channel MOSFET 231A (PMOS-A) is controlled by the output of the op amplifier OPA, whereby a voltage Vdd, which changes linearly according to a signal Ramp inputted from the base band & modulation unit 300 at this time, based on the power supply voltage Vb outputted from a battery 400, is supplied to its corresponding high frequency power amplifier 210. At this time, the DC—DC converter 232 is brought to a non-operating state by a signal outputted from the control logic CTL.

On the other hand, when a middle output level is requested or a low output level is required, the PMOS selector switch 236 is changed over to the P-channel MOSFET 231B (PMOS-B) so that the P-channel MOSFET 231B (PMOS-B) is controlled by the output of the op amplifier OPA and the DC—DC converter 232 is brought to an operating state according to a signal outputted from the control logic CTL, whereby on the basis of a stepped-down voltage generated by the DC—DC converter, a voltage Vdd, which changes linearly according to a signal Ramp inputted from the base band & modulation unit 300 at this time, is supplied to the high frequency amplifier circuit 210.

Further, the power supply module 230' according to the present embodiment is configured so as to be available even for the cases in which it constitutes such a CDMA system as shown in FIG. 4 and such a GSM closed-loop type system as shown in FIG. 6. Described specifically, when the P-channel MOSFET 231A or 231B (PMOS-A or PMOS-B) located on the side selected by the PMOS selector switch 236 is turned on, the output of the op amplifier OPA is brought to full amplitude to thereby hold the MOSFET located on the selected side in an on state, thus making it possible to supply the voltage with almost no reduction in level.

While the invention made above by the present inventors has been described specifically based on the illustrated embodiments, the present invention is not limited to the embodiments. It is needless to say that various changes can be made thereto without the scope not departing from the substance thereof. While the embodiments shown in FIGS. 4 through 6 have been described as the system configurations of the cellular phone dedicated for the CDMA system, the cellular phone dedicated for the GSM-system open loop type, and the cellular phone dedicated for the GSM-system closed-loop type, respectively, each of the embodiments may be configured as a cellular phone wherein the coupler 260' for detecting the output level of such a GSM high frequency power amplifier 210 as shown in FIG. 6 and the automatic power control circuit 270' for comparing the output level detected by the coupler 260' and the required output level to thereby generate the bias voltage Vabc for the high frequency power amplifier 210 are added to the system shown in FIG. 1 and which is thus capable of operation even in a closed-loop mode for activating the automatic power control circuit 270', an open-loop mode for operating a Vdd generator comprising the op amplifier OPA and the P-channel MOSFET 231, and any mode for CDMA. In such a case, the power supply circuit 230 can be utilized.

While the above-described embodiment has described the case in which the DC—DC converter, the voltage control transistor and the power control semiconductor integrated circuit for controlling the voltage control transistor are packaged on one insulating substrate like the ceramic substrate and configured as the power supply module, an inductor and a condenser connected to an output terminal of a power supply system are formed inside the insulating substrate, and they may be configured as a power supply module inclusive of these.

Further, while the above embodiment has described the power supply circuit for the high frequency power amplifier, which is capable of performing communications of the two types of the GSM system and the CDMA system, the invention can be applied to a power supply circuit for a high frequency power amplifier of a cellular phone capable of performing communications for a dual-band type and a CDMA system capable of handling or processing signals lying in such a frequency band as in a DCS (Digital Cellular System) using a 1710 to 1785-MHz band, for example, and for a triple-band type and a CDMA system capable of handling signals of a PCS (Personal Communication System) using a 1850 to 1915-MHz band.

Incidentally, while the present embodiment has used the system of obtaining the respective control signals designated at SHDN, CONT0, CONT1 and CONT2 from the base band, a method of configuring a system for reducing signal lines and receiving a serial signal, providing a power control integrated circuit with a determination circuit, and performing equal switching is also practically considered.

Advantageous effects obtained by a typical one of the inventions disclosed in the present application will be described in brief as follows:

According to the present invention, a reduction in power consumption can be realized. As a result, a cellular phone using a power supply circuit of the present invention brings about the effect of making a calling time long and increasing the life of a battery. The invention can be used in a cellular phone capable of communicating according to a plurality of systems like a GSM system and a CDMA system, and a power supply circuit capable of reducing power consumption can be realized. Even where a power supply circuit capable of performing complex control with multi-functioning of a cellular phone is configured, a power supply circuit, which is reduced in the number of parts thereby reducing its size, can be configured.

What is claimed is:

1. A power supply system for a high frequency power amplifier, comprising:

a voltage converter circuit which switching-controls a current flowing through an inductor to thereby generate a desired voltage;

a voltage control transistor which outputs a voltage corresponding to a control voltage in response to a voltage outputted from a power supply; and a power control circuit which controls the voltage control transistor, wherein one or more semiconductor integrated circuits and one or more electronic parts are packaged on one insulated substrate, wherein in a first mode, the voltage converter circuit is brought to a non-operating state upon a high output to turn on the voltage control transistor so as to output the voltage sent from the power supply to a power output terminal, and the voltage converter circuit is operated upon a low output to output a voltage converted by the voltage converter circuit to the power output terminal, and wherein in a second mode, the voltage converter circuit is brought to a non-operating state to control the voltage control transistor based on a first signal for designating an output level, thereby outputting a voltage corresponding to the first signal to the power output terminal.

2. The power supply system according to claim 1, wherein the voltage control transistor is a P-channel type field effect transistor.

3. The power supply system according to claim 2, wherein the power control circuit includes an operational amplifier circuit which has a first input terminal to which the first signal is inputted and a second input terminal to which a second signal corresponding to an output voltage is fed back, and which outputs the voltage corresponding to the first signal.

4. The power supply system according to claim 1, wherein a filter circuit using a ferrite bead as an inductor is connected to an output terminal of the voltage converter circuit.

5. The power supply system according to claim 1, wherein the voltage converter circuit complementarily on-off controls a first switch element and a second switch element connected in series between a source voltage terminal and a reference potential terminal to allow a current to flow through the inductor connected between a connecting node of the first switch element and the second switch element and an output terminal, thereby outputting a voltage obtained by stepping down the voltage applied to the source voltage terminal, and wherein when the first signal indicates a predetermined level or less, the voltage converter circuit controls the second switch element so as not to turn on the second switch element and thereby outputs a desired voltage under a switching operation of the first switch element.

6. The power supply system according to claim 1, wherein the inductor connected to the output terminal of the voltage converter circuit, and a smoothing capacitive element connected to the other end of the inductor are packaged on the insulating substrate.

7. The power supply system according to claim 1, wherein the first mode is a mode for performing a transmit operation according to a GSM-system closed-loop type, and the second mode is a mode for performing a transmit operation according to a GSM-system open loop type.

8. The power supply system according to claim 1, wherein the first mode is a transmit operation according to a CDMA system, and the second mode is a transmit operation according to a GSM-system open loop type.

9. A power supply system for a high frequency power amplifier, comprising:

a voltage converter circuit which switching-controls a current flowing through an inductor to thereby generate a desired voltage;

first and second power control transistors which respectively have drain terminals connected to a common power output terminal and which control a voltage outputted from a power supply and outputs the same to the power output terminal;

a power control circuit which controls the power control transistors; and a switching circuit which is provided between the power control circuit and a control terminal for the first and second power control transistors and allows any one of the power control transistors to be connected to the power control circuit, wherein one or more semiconductor integrated circuits and one or more electronic parts are packaged on one insulating substrate, wherein in a first mode, the voltage converter circuit is brought to a non-operating state upon a high output to control the first voltage control transistor based on a signal for designating an output level, thereby controlling the voltage outputted from the power supply and outputting the same to the power output terminal, whereas upon a low output, the voltage converter circuit is operated and the second voltage control transistor is controlled based on the signal for designating the output level to thereby control the voltage outputted from the voltage converter circuit and output the same to the power output terminal, and wherein in a second mode, the voltage converter circuit is brought to a non-operating state upon a high output to output the voltage sent from the power supply to the power output terminal via the first voltage control transistor, whereas upon a low output, the voltage converter circuit is operated to output the voltage converted by the voltage converter circuit to the power output terminal via the second voltage control transistor.

10. The power supply system according to claim 9, wherein the voltage converter circuit, the power control circuit for controlling the first and second voltage control transistors, and the switching circuit are configured on one semiconductor substrate as a semiconductor integrated circuit, and the semiconductor integrated circuit, the first voltage control transistor, and second voltage control transistor are packaged on one insulating substrate so as to be configured as a module.

* * * * *